INVENTOR.
John J. Antalek
BY
[signature]
ATTORNEY

May 9, 1950 J. J. ANTALEK 2,506,762

PIEZOELECTRIC CRYSTAL OSCILLATOR

Filed May 28, 1943 3 Sheets-Sheet 2

INVENTOR.
John J. Antalek
BY [signature]
ATTORNEY

May 9, 1950 J. J. ANTALEK 2,506,762

PIEZOELECTRIC CRYSTAL OSCILLATOR

Filed May 28, 1943 3 Sheets-Sheet 3

INVENTOR.
John J. Antalek

BY

ATTORNEY

Patented May 9, 1950 2,506,762

UNITED STATES PATENT OFFICE 2,506,762

PIEZOELECTRIC CRYSTAL OSCILLATOR

John J. Antalek, Chicago, Ill., assignor to The Rauland Corporation, Chicago, Ill., a corporation of Illinois Application May 28, 1943, Serial No. 488,853

2 Claims. (Cl. 250—36)

This invention relates to oscillators employing electron tubes, as used for the initial generation of electrical oscillations having a predetermined frequency. Such an oscillator may be used either directly as a radio transmitter or may be used to control electron tubes of higher power capacity forming part of such a transmitter. However, the oscillator of this invention may be employed for the generation of electrical oscillations for any purpose, although it is particularly applicable to cases where it is desirable that the frequency of such oscillations be kept substantially constant, at least at times.

One object of this invention is to provide an oscillator of the type described, in which the stability of frequency control may be secured either by means of a piezoelectric crystal or by means of a resonant circuit comprising physical inductance and capacity.

Another object of this invention is to provide, in such an oscillator, means for rapidly and easily switching the oscillator, so that the frequency thereof will be determined either by the crystal or by the resonant circuit.

Yet another purpose of this invention is to provide, in an oscillator of the type described, a circuit including a piezoelectric crystal, in which circuit there may be employed such a crystal having a degree of activity relatively low compared with the degree of activity requisite in such a crystal for satisfactory operation with oscillators of the types previously known in the art.

Still another object of this invention is to provide an oscillator in which the output may be keyed at a relatively high rate of speed.

A still further object of this invention is to provide an oscillator, embodying a piezoelectric crystal in which the frequency of the output obtained therefrom, when the circuit is under the control of the crystal, may be predeterminedly selected so as to correspond not only to the fundamental frequency of such crystal, but may alternatively be selected to correspond to some harmonic of such fundamental frequency, while maintaining high efficiency and utilizing substantially the maximum permissible energy output obtainable from the electron tube employed in such oscillator.

Other purposes and advantages of this invention will be later described in connection with the description of certain embodiments thereof, or will be apparent to those skilled in the art.

Referring now to the drawings,

Fig. 1 is a schematic showing of one form of electronic oscillator employed in the prior art and using either a crystal or a resonant circuit for frequency control;

Fig. 1*a* is a schematic drawing showing one mode of connection used in the prior art to secure capacitative feedback;

Fig. 1*b* shows schematically another mode of connection used to secure feedback, as used in the prior art;

Figure 1:
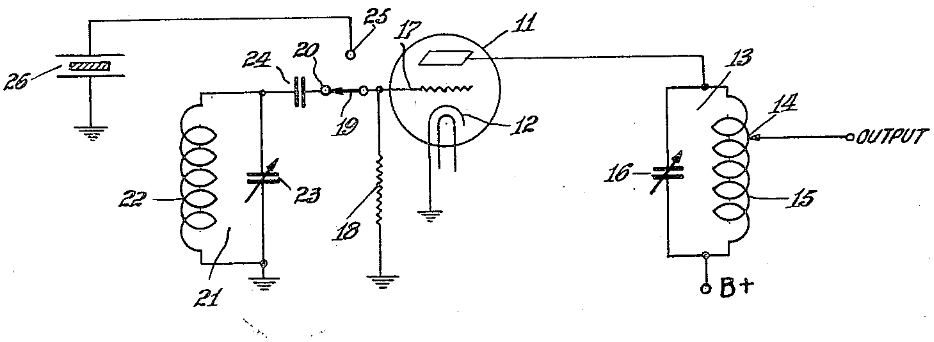

Referring now to Fig. 1, there is here shown one type of oscillator employed in the prior art to allow the use either of a crystal or a resonant circuit as the frequency controlling element.

In Fig. 1 a triode 11 has its cathode 12 grounded and a parallel resonant circuit 13 connected in its anode feed circuit. The power output of the oscillator may be drawn from any convenient point of circuit 13, e. g. from a tap 14 on inductance 15 of such circuit. The condenser 16 of this circuit in indicated as variable, in order that the resonant period of the circuit may be varied. The grid 17 of triode 11, is maintained at a suitable D. C. potential by connection to the ground through suitable grid leak resistor 18. A switch 19 has its movable arm connected to grid 17 and can be moved so as to make contact with a fixed stud 20, thus connecting the oscillator to a resonant circuit 21, comprising inductance 22 and variable capacity 23, this connection being made through isolation condenser 24. When switch 19 is in this position, as indicated in Fig. 1, the frequency of oscillation will be determined by the tuning of resonant circuits 21 and 13, these two circuits being tuned to an identical frequency. Under such condition of operation, the frequency stability is by no means satisfactory for many purposes, especially in the case of radio, telegraph or telephone transmission. This frequency instability arises from several causes, one of these being that changes in the load applied to the anode circuit will cause such reflected changes in the virtual tube constants as to bring about changes in the oscillatory period. When the arm of switch 19 is thrown to the other contact 25, piezoelectric crystal 26 becomes the determining factor in setting the frequency of the oscillator.

With the device shown in Fig. 1, it is to be noted that the position of switch 19, directly connected to the oscillator grid, furnishes another source of difficulty, since this particular point adjacent the grid is very susceptible to any change in capacity and resistance, and a mechanically operated switch is prone to such capacitative and resistive changes. When telegraphic keying is applied to the circuit of Fig. 1, it is found that high speed keying does not operate satisfactorily, which constitutes a further disadvantage of this type of oscillator. When an attempt is made to raise the permissible speed of keying by increasing the feedback action in tube 11 or by furnishing external means to bring about such feedback, the operation of the oscillator under crystal control becomes unsatisfactory, when it is desirable to obtain from tube 11 an output approaching the rating of such tube. Since the feedback action causes an increased flow of current through crystal 26, this increased current flow through the crystal raises the temperature thereof which, in turn, alters the resonant frequency of such crystal, as well known in the art.

Figure 1A:
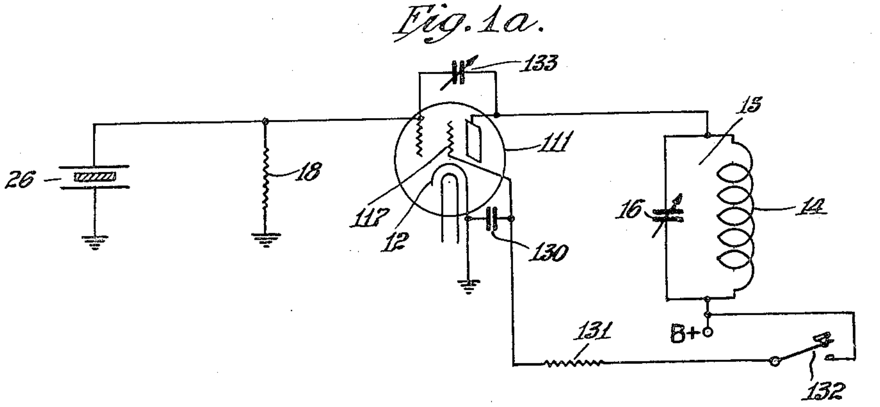

In Fig. 1*a* there is indicated a tetrode oscillator 111 having its frequency determined by crystal 26, connected in conjunction with grid resistor 18. The screen grid 117 of the tetrode is suitably bypassed to ground by condenser 130 and obtains current from the anode supply source through resistor 131. A key 132 is likewise placed in series with the screen grid. A feedback condenser 133 is bridged from the anode to the control grid of tube 111. The other elements in Fig. 1*a* correspond to those bearing similar reference characters in Fig. 1.

The operation of the oscillator shown in Fig. 1*a*, while somewhat more satisfactory than that shown in Fig. 1, yet is subject to certain difficulties, one of the most serious being the excessive oscillatory current which the feedback action causes to flow through crystal 26, thus heating the latter and causing frequency deviation, as previously explained in connection with Fig. 1.

Figure 1B:
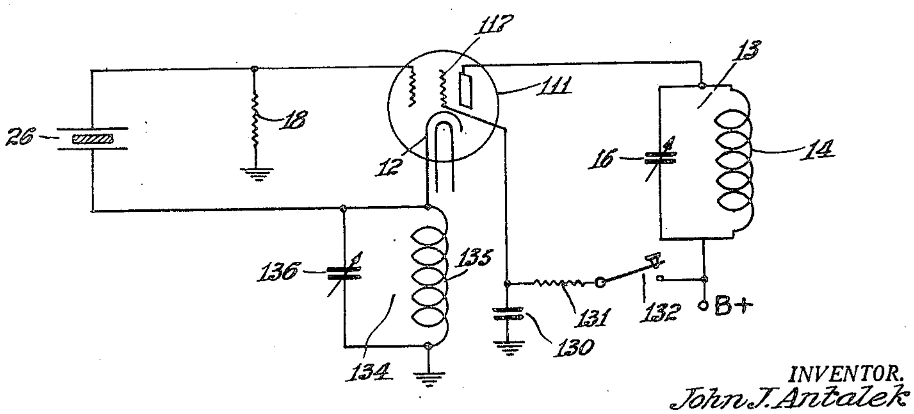

Fig. 1*b* shows a tetrode oscillator somewhat similar to that shown in Fig. 1*a*, and similar elements bear corresponding reference numerals. However, the feedback action in the circuit of Fig. 1*b* is obtained by another parallel resonant circuit 134 comprising inductance 135 and variable capacity 136, employed between the cathode 12 and the ground, in order to secure feedback action, crystal 26 being coupled to the point of connection between cathode 12 and resonant circuit 134. This oscillator circuit demands the adjustment of two separate resonant circuits 13 and 134, respectively, to the desired frequency to correspond with the frequency of crystal 26, or a harmonic thereof. This means that any change of frequency will necessitate the adjustment of a considerable number of elements. Likewise, the increased keying speed afforded by this particular oscillator, has the advantages thereof off-set by the increased current flow through crystal 26, with the resulting disadvantages previously described. Additionally, the amount of feedback obtainable through circuit 134 needs to be changed when the frequency is altered to a considerable degree, if good efficiency is to be maintained. This means that still another adjustment must be made if the oscillator of Fig. 1*b* is to provide satisfactory operation over a wide band of frequencies.

Figures 2, 3, 4:
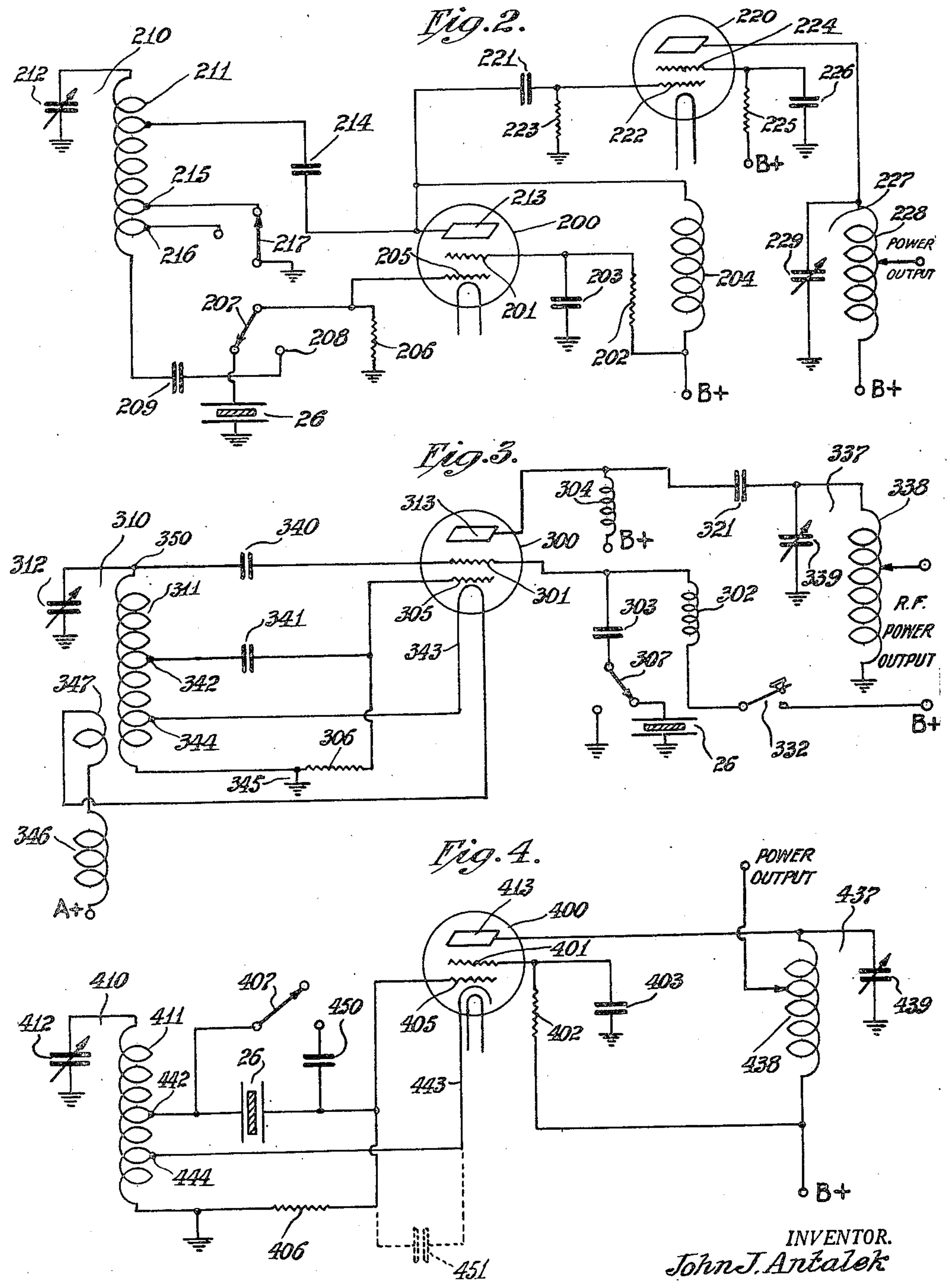
Fig. 2 is a schematic showing of a two tube oscillator, as used in the prior art, allowing alternative frequency control.
Fig. 3 shows schematically one embodiment of an oscillator according to this invention, using a tetrode.
Fig. 4 shows another form of this invention, also using a tetrode.

Referring now to Fig. 2, there is here shown a commonly employed type of oscillator used in order to secure operation under either crystal or resonant circuit control, using two tetrodes. This circuit not only has the disadvantage of requiring a double switching action when changing from crystal to resonant circuit control, but is difficult to operate at other than the fundamental frequency of the crystal, so that the production of oscillations at frequencies corresponding to harmonics of the crystal, which is frequently desirable, is not easily obtained when this circuit is employed, although harmonic operation of oscillator frequencies is possible in harmonic amplifier tube, 220, by tuning the circuit 227 to the desired harmonics. The chief disadvantage is the additional tube required in this circuit, as well as the need for tuning several discrete circuits whenever the frequency of operation is to be changed.

The tetrode 200 has the screen grid 201 supplied from the source of anode power through a dropping resistor 202 and supplied with the usual by-pass condenser 203. The anode supply is obtained through a choke coil 204. Control grid 205 is maintained at a suitable D. C. potential by grid leak resistor 206 and may be transferred by means of switch 207, either to crystal 26 or to stud 208 which affords connection through isolation condenser 209 to resonant frequency controlling circuit 210, comprising inductance 211 and variable capacity 212. The anode 213 of tube 200 is likewise coupled through condenser 214 to a suitable point on inductance 211. Suitable intermediate points 215 and 216 of inductance 211 are alternatively grounded by operation of switch 217. In order to operate this oscillator under crystal control, switch 207 must be thrown to the left, while switch 217 must be thrown to the right. In order to change to resonant circuit control, both the switches just referred to must be thrown to their respective other positions, thus necessitating double switching action.

In the oscillator of Fig. 2, it will likewise be noted that in order to secure a satisfactory degree of frequency stability, the power output is obtained, not directly from tube 200, but from buffer tube 220, which may likewise be of the tetrode type as here indicated. The oscillatory energy is drawn from anode 213 of tube 200 through coupling condenser 221, feeding control grid 222 of tube 220, the D. C. potential of this grid being held at a suitable point by means of grid leak resistor 223. Screen grid 224 is energized through dropping resistor 225 and suitably by-passed by condenser 226. The output resonant circuit 227 comprising inductance 228 and capacity 229 may be connected in the series feed to the anode of tube 220 and the power output drawn from a suitable point of this circuit. This oscillator suffers from the disadvantages of complexity, employment of two tubes, inability to be keyed at high speeds due to poor crystal starting time, and inability to operate the oscillator tube itself, 200, at harmonic frequencies of the crystal, thereby requiring the use of an additional electronic tube, such as the harmonic amplifier tube, 220.

In the case of the circuits shown both in Fig. 1 and Fig. 2, it is necessary to employ a piezoelectric crystal possessing relatively high activity with respect to the production of oscillations thereby.

Referring now to Fig. 3, there is here shown an oscillator according to this invention, in which a resonant circuit determines the frequency of oscillation either alone, or in conjunction with a piezo-electric crystal, which crystal is so arranged as to provide a low impedance circuit for feedback between the screen grid and the control grid of the oscillator tube.

In Fig. 3, the tetrode 300 has its screen grid 301 fed through choke coil 302, in series with which is signaling key 332. The screen grid coupling condenser 303 may be grounded through switch 307, either directly, or through the intermediary of crystal 26. The anode 313 of tube 300 receives its energy through choke coil 304, while control grid 305 is grounded through a suitable grid leak resistor 306. The resonant circuit 310 comprises inductance 311 and variable capacity 312. The screen grid and the control grid of tube 300 are connected, respectively, through condenser 340 to point 350 and through condenser 341 to point 342 of inductance 311, while the left-hand terminal of directly heated cathode 343 is coupled to another point 344 of inductance 311, thus finding its ground as indicated at 345, through the lowest portion of inductance 311. The feed for the directly heated cathode is obtained through radio frequency choke coil 346 and coil 347, which latter is inductively coupled to element 311.

The output of the oscillator shown in Fig. 3 is obtained from the resonant circuit 337 comprising inductance 338 and variable capacity 339. This resonant circuit is coupled in parallel feed to anode 313 through isolation condenser 321, and the power output may be withdrawn from this circuit by coupling to any suitable point of inductance 338, as indicated in the drawing. It is understood that the negative terminal of both the cathode and anode power supply is grounded.

Circuit 310 is tuned either to the fundamental frequency of crystal 26, or to any odd harmonic thereof. This makes it possible to obtain, for example, 1500, 2500, 3500, 4500, and so forth, kilocycles, when the crystal employed has a fundamental frequency of 500 kc. This is done simply by tuning resonant circuit 310 to any of these frequencies. The tube 300 is neutralized by means of condenser 340, in order to prevent unwanted feedback action, and the desired feedback action, obtained through the intermediary of crystal 26, determines the operation of the oscillator as a whole. Output circuit 337 is tuned to a frequency corresponding to that at which circuit 310 is oscillating, or preferably, to a harmonic thereof, for maximum stability of frequency with plate circuit 337, subject to variable loading. The load circuits are connected to intermediate or tapped down points of both inductances, 311 and 338, in order to get minimum frequency deviation when the anode circuit load is varied.

The circuit of Fig. 3 constitutes a crystal controlled electron coupled oscillator. This circuit provides an extremely simple method of switching so as to cause the frequency of the oscillator to be at either the fundamental or some harmonic of the frequency exhibited by crystal 26, while this crystal may alternatively be completely removed from the circuit so that the output of the oscillator may be adjusted to other frequencies bearing no necessarily direct relation to the fundamental frequency of crystal 26. This switching is accomplished in a low impedance ground circuit which exerts very little influence on the frequency of the oscillator as a whole, even though relatively large changes in the capacity or resistance of switch 307 and its associated elements may occur. As an example of the frequency stability obtained in the case of an actual oscillator employing the circuit of Fig. 3, when the oscillator was under crystal control, the frequency deviated only a few cycles when the plate load was varied from minimum to maximum. When the crystal control was removed, a similar change in plate load caused a frequency deviation not greater than 0.003%.

An alternative method of adjusting the circuit shown in Fig. 3 is to adjust output circuit 337 to equal the fundamental frequency of crystal 26. Resonant circuit 310 is then tuned so that the crystal frequency will be equal to a harmonic frequency of that to which circuit 310 is tuned. When employing this particular adjustment of the circuit shown in Fig. 3, a special care must be taken in the tuning of all circuits, since they are more critical with respect to adjustment then when the circuits are tuned as first described, where explaining Fig. 3.

The keying speed of the circuit shown in Fig. 3 is considerably higher than circuits known in the prior art and not employing feedback. At the same time the circuit of Fig. 3 results in a comparatively low flow of current through crystal 26, usually less than ten milliamperes, this low value of current minimizing any frequency drift which might be caused by an elevation of temperature of crystal 26, if a larger current were flowing through, as previously explained in connection with Figs. 1*a* and 1*b*.

No feed back adjustment such as a variable capacity is required or provided in the circuit of Fig. 3. In fact this circuit does not necessarily require neutralization, as by condenser 340, which latter is only used to prevent oscillation when circuit 310 is not tuned to the crystal frequency or to a harmonic thereof. Condenser 340 may be left out in order to provide even greater keying speeds with crystals having relatively poor oscillating qualities. The lack of feed-back requirement is one of the advantages of this circuit.

The circuit of Fig. 3 embodies a "buffering" action, due to the employment of electron coupling between the grid "tank" circuit 310 and the output anode circuit 337, while the crystal frequency control is confined to the screen grid circuit.

Referring now to Fig. 4, there is here shown a form of this invention in which the switching is accomplished in a circuit having somewhat higher impedance than the one just described, so that greater precautions may be necessary to avoid frequency changes due to variations in the effective capacity of the switch.

In Fig. 4 tetrode 400 has its screen grid 401 fed through a suitable dropping resistor 402 and bypassed directly to ground by capacity 403. The anode 413 is series fed through inductance 438, which, together with variable capacity 439 constitutes tuned output circuit 437, from which the power may be tapped at any suitable point as indicated in the drawing. Control grid 405 is grounded through grid leak resistor 406 so as to be maintained at a suitable D. C. potential. A crystal 26 is connected to grid 405 at the one end and to tap 442 at the other end. Tap 442 is taken off on inductance 411 which, together with variable capacity 412, constitutes a grid tank circuit 410. Switch 407 is arranged so as, when closed, to shunt condenser 450 across crystal 26, thus effectively eliminating the frequency control action of this crystal, when the switch is closed, The cathode 443 is connected to a lower tap 444 of inductance 411.

While neutralization of the tube capacity may not be necessary in every instance, especially when the capacity of the crystal and control switch assembly is kept at a low value, it is possible to obtain such neutralization, for example, by introducing a neutralizing condenser 451 between the control grid and the cathode of the oscillator tube, thus preventing the circuit from oscillating except when resonant circuit 410 is tuned to the fundamental or to some odd harmonic frequency of crystal 26.

Figure 5:
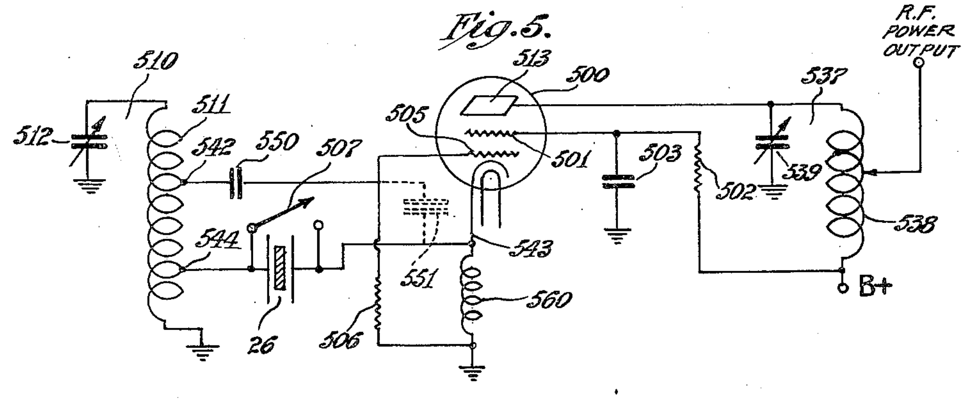
Figs. 5 and 6 show still further forms in which this invention may be embodied, when tetrodes are employed therewith.

In Fig. 5 tube 500 has its screen grid 501 fed through dropping resistor 502 and by-passed to ground by condenser 503. Anode 513 is series fed through inductance 538, which together with capacity 539, constitutes tuned output circuit 537 from which the power output may be obtained by a suitable tap on inductance 538. Grid tank circuit 510, comprising inductance 511 and capacity 512, is grounded at one end and coupled to the cathode from tap 544 through crystal 26, the latter being arranged so as to be capable of short-circuit by means of switch 507. A suitable radio frequency choke coil 560 isolates cathode 543 from the ground. Control grid 505, maintained at a suitable potential by resistor 506, is coupled via condenser 550 to tap 542 of inductance 511, thus comprising a well known oscillatory circuit. Neutralizing condenser 551 may be connected between control grid and cathode, if need be, as explained in connection with Fig. 4. Feed-back is brought about by the virtual grounding of the screen grid.

Figure 6:
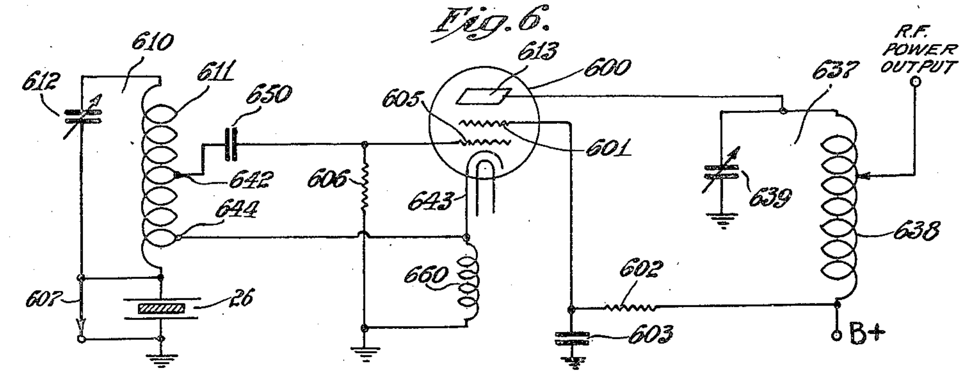

The oscillator shown in Fig. 6 is fundamentally similar to that shown in Fig. 5 and similar elements bear corresponding reference numerals in the two figures.

In the particular circuit of Fig. 6, crystal 26 is interposed between the lower end of inductance 611 and the ground, instead of being located in the cathode lead, as was the case in Fig. 5. Switch 607 serves to short-circuit crystal 26 when the frequency is to be determined by tank circuit 610. The particular location of the crystal shown in Fig. 6 is somewhat more advantageous than that shown in Fig. 5, since external capacity effects of the crystal relative to the device in which it is mounted and relative to the switch 607, will be less pronounced in the circuit of Fig. 6, due to the fact that same portion of each of the elements just recited are, in this particular case, at ground potential.

Figure 7:
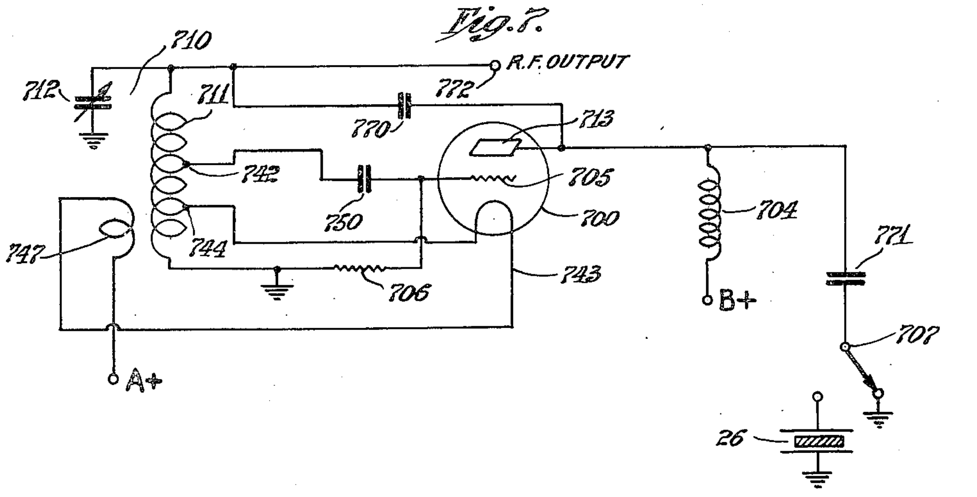
Fig. 7 is a schematic showing of an oscillator employing a triode according to this invention.

The circuit of Fig. 7 employs a triode 700 and may be operated at a number of harmonic frequencies of the fundamental frequency exhibited by crystal 26.

The circuit of Fig. 7 does not employ the electron coupled oscillator used in Fig. 3, but the tank circuit, grid circuit and anode feed circuit are similar to those shown in Fig. 3 and bear corresponding reference numerals. The directly heated cathode is similarly fed through the lower portion of inductance 711 and the inductance 747. The frequency of this oscillator is determined by the tuning of tank circuit 710, and power output terminal 772 is shown as coupled to the top of inductance 711, although it is to be understood that such power output may be tapped down along this inductance, if so desired. The feed-back action is obtained by coupling anode 713, through condenser 711 and directly or through the crystal 26, via the ground circuit, to the grid circuit through inductance coil 711 of tuned circuit 710.

Condenser 770 is employed to neutralize the tube and to prevent oscillation when circuit 710 is not tuned to the crystal frequency or to a harmonic thereof. The anode circuit may be directly grounded, inasfar as radio frequency is concerned through condenser 771, by throwing switch 707 to the ground stud thereof. When switch 707 is thrown to the left, crystal 26 is interposed in such ground connection and serves to stabilize the frequency of the oscillator. However, the oscillator of Fig. 7 does not approach the frequency stability exhibited by the oscillator shown in Fig. 3, but due to its greater simplicity, the oscillator of Fig. 7 may frequently be found desirable. Likewise the crystal current is considerably higher in this circuit than in the case of the circuit of Fig. 3, unless the tube is operated under reduced power conditions.

The circuits of Figs. 4, 5, 6 and 7 cannot be used with the alternative adjustment previously described in connection with Fig. 3, where the grid circuit is tuned to a sub-harmonic of the fundamental frequency of the crystal. Likewise, these circuits will not operate with the degree of stability possessed by the circuit of Fig. 3, when the respective grid circuits 410, 510, 610, or 710 are tuned to an odd harmonic frequency of the fundamental frequency of the crystal used. Tests also have shown that the allowable keying speed of the circuit of Fig. 3 is considerably higher than is possible in the circuits shown in Figs. 4, 5, 6 and 7. However, these latter circuits show some improvement over the circuits shown in Figs. 1 and 2, as known in the prior art.

The output of the oscillator in the form of Figs. 3 and 7 is affected only very slightly when such circuit is used with a crystal displaying a relatively low activity or with a crystal displaying a relatively high oscillatory activity. Such stability does not occur when such crystals are employed in other circuits where, on the contrary, the output will vary with the relative degree of crystal activity. Crystals having a relatively low or a relatively high fundamental frequency may be employed in the circuit shown in Fig. 3, and may be keyed at very high speeds.

What is claimed is:

1. Electronic oscillator assembly including a tetrode, energy supply means for the elements thereof, a tank circuit at least an inductive portion of which is connected to the cathode and control grid of said tetrode, an output circuit connected to the anode of said tetrode, a piezo-electric crystal connected between the lower end of the inductance of said tank circuit and the ground, and switching means for short-circuiting said crystal, whereby said oscillator may optionally be operated with or without crystal control of frequency, said oscillator also including a condenser effectively grounding the screen grid of said tetrode with respect to oscillatory currents and an impedance connected between the cathode of said tetrode and the ground.

2. Electronic oscillator assembly including a multi-electrode discharge device having at least a cathode, a control grid, a screen grid and an anode, energy supply means for the screen grid and the anode, a condenser connected between the screen grid and the negative terminal of the supply means and having a low value of reactance at the frequency of the lowest oscillatory component of the discharge current through the device, an output circuit connected to the anode, a tank circuit at least a portion of the inductance of which is connected between the cathode and the control grid, a circuit connecting the cathode to said negative terminal over another portion of said inductance so positioned thereon with respect to the first-mentioned portion that both portions are in series between the control grid and said negative terminal, a piezoelectric crystal included in series in said last-mentioned circuit and a choke coil connected between the cathode and the negative terminal, said crystal being connected in said circuit between an end of said inductance and said negative terminal.

JOHN J. ANTALEK.

REFERENCES CITED

The following references are of record in the file of this patent:

UNITED STATES PATENTS

| Number | Name | Date |
|---|---|---|
| 1,654,184 | Meyer | Dec. 27, 1927 |
| 1,761,882 | Eberhard | June 3, 1930 |
| 1,788,219 | White | Jan. 6, 1931 |
| 1,830,837 | Hentschel | Nov. 10, 1931 |
| 1,847,190 | Morrison | Mar. 1, 1932 |
| 1,921,844 | Schumacher | Aug. 8, 1933 |
| 1,975,615 | Peterson | Oct. 2, 1934 |
| 1,992,035 | Meahl | Feb. 19, 1935 |
| 2,027,448 | Peterson | Jan. 14, 1936 |
| 2,051,936 | Braaten | Aug. 25, 1936 |
| 2,066,027 | Braaten | Dec. 29, 1936 |
| 2,146,961 | Lamb | Feb. 14, 1939 |
| 2,220,956 | Hansell | Nov. 12, 1940 |
| 2,298,774 | Parker | Oct. 13, 1942 |
| 2,311,026 | Bishop | Feb. 16, 1943 |
| 2,311,163 | Edwards | Feb. 16, 1943 |
| 2,452,951 | Norgaard | Nov. 2, 1948 |

FOREIGN PATENTS

| Number | Country | Date |
|---|---|---|
| 428,581 | Great Britain | May 15, 1935 |

OTHER REFERENCES

QST for June 1936, page 18. (Copy in Library.)

Short Wave Craft for May 1936, pages 26 and 27. (Copy in Library.)

Certificate of Correction

Patent No. 2,506,762 May 9, 1950

JOHN J. ANTALEK

It is hereby certified that errors appear in the printed specification of the above numbered patent requiring correction as follows:

Column 2, line 32, for the word "in", first occurrence, read *is*; column 8, line 50, for "a tank circuit at least an inductive" read *an inductive tank circuit at least a*;

and that the said Letters Patent should be read with these corrections therein that the same may conform to the record of the case in the Patent Office.

Signed and sealed this 25th day of July, A. D. 1950.

[SEAL]

THOMAS F. MURPHY,
*Assistant Commissioner of Patents.*